(12) United States Patent
Jiwari

(10) Patent No.: US 6,939,806 B2
(45) Date of Patent: Sep. 6, 2005

(54) ETCHING MEMORY

(75) Inventor: Nobuhiro Jiwari, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 218 days.

(21) Appl. No.: 10/277,725

(22) Filed: Oct. 23, 2002

(65) Prior Publication Data

US 2003/0077909 A1 Apr. 24, 2003

(30) Foreign Application Priority Data

Oct. 24, 2001 (JP) ........................................ 2001-325813

(51) Int. Cl.$^7$ ........................................... H01L 21/311
(52) U.S. Cl. ....................... 438/700; 438/723; 438/724
(58) Field of Search ................... 438/700, 706, 438/710, 714, 723, 724

(56) References Cited

U.S. PATENT DOCUMENTS

| | | | | |
|---|---|---|---|---|
| 5,650,339 A | * | 7/1997 | Saito et al. .................. | 438/164 |
| 5,780,338 A | * | 7/1998 | Jeng et al. ................... | 438/253 |
| 6,337,285 B1 | * | 1/2002 | Ko .............................. | 438/714 |
| 6,448,179 B2 | * | 9/2002 | Kim et al. .................... | 438/672 |
| 6,635,185 B2 | * | 10/2003 | Demmin et al. .............. | 216/64 |
| 6,716,766 B2 | * | 4/2004 | Ko .............................. | 438/734 |

FOREIGN PATENT DOCUMENTS

JP          9-92640          4/1997

* cited by examiner

Primary Examiner—Kin-Chan Chen
(74) Attorney, Agent, or Firm—McDermott Will & Emery LLP

(57) ABSTRACT

The etching method of the present invention for forming a hole having a high aspect ratio in a silicon oxide film formed on a substrate via a silicon nitride film includes the step of performing etching using an etching gas composed of a mixture of Ar gas, $O_2$ gas, $C_5F_8$ gas and $CH_2F_2$ gas.

10 Claims, 9 Drawing Sheets

ETCHING MEMORY

BACKGROUND OF THE INVENTION

The present invention relates to an etching method for forming holes having a high aspect ratio in a silicon oxide film formed on a substrate via a silicon nitride film.

With increasing reduction in the size of semiconductor devices, the amount of displacement in alignment of masks placed one upon the other has become too critical to be negligible. For example, if the amount of displacement in alignment of masks for gate interconnections and contact holes is great, a gate interconnection and a conductive film with which a contact hole is filled may disadvantageously be short-circuited, causing a failure of operation of the device.

To overcome the above problem, an etching method called a self-aligning contact etching method has been proposed. This etching method will be described with reference to FIG. 9A.

Referring to FIG. 9A, gate interconnections (gate electrodes) 103 composed of a polysilicon film are formed on a silicon substrate 100 via a gate insulating film 102. The silicon substrate 100 includes a cobalt silicide layer 101 formed over a source/drain region. A silicon nitride film 104 having a thickness of 10 to 80 nm is deposited on the space between the gate interconnections 103 and the top and side faces of the gate interconnections 103. A silicon oxide film 105 is formed over the silicon nitride film 104.

The silicon oxide film 105 is subjected to plasma etching via a mask of a resist pattern 106 having hole formation openings, to form a contact hole 107 though the silicon oxide film 105 so that the contact hole 107 is positioned at the space between the gate interconnections 103.

In the above etching, the portion of the silicon oxide film 105 deposited in the space between the gate interconnections 103 must be etched away while the portions of the silicon nitride film 104 deposited on the side faces of the gate interconnections 103 are kept from etching. This disadvantageously reduces the margin of the etching time.

In addition, after the removal of the portion of the silicon oxide film 105 in the space between the gate interconnections 103 by etching, the portion of the silicon nitride film 104 exposed on the bottom of the contact hole 107 must be etched away to expose the cobalt silicide layer 101. During this etching, the portions of the silicon nitride film 104 on the side faces of the gate interconnections 103 may also be etched and this may possibly result in exposure of the gate interconnections 103 to the contact hole 107.

To prevent the above problem, proposed has been a method of etching the silicon oxide film 105 with an etching gas containing fluorocarbon gas, such as an etching gas composed of a mixture of Ar gas, $O_2$ gas and $C_5F_8$ gas, for example.

By use of such an etching gas composed of a mixture of Ar gas, $O_2$ gas and $C_5F_8$ gas for etching of the silicon oxide film 105, a deposition attaches to the wall of the contact hole 107 forming a deposition layer throughout the etching. This enables securing of a margin of the etching time and also eliminates the possibility of exposure of the gate interconnections 103 to the contact hole 107.

However, with increase of the aspect ratio of the contact hole 107, the growth of the deposition layer on the wall of the contact hole 107 may exceed the progress of the etching of the portion of the silicon oxide film 105 on the bottom of the contact hole 107. As a result, this may stop the etching of the portion of the silicon oxide film 105 on the bottom of the contact hole 107, as shown in FIG. 9B.

SUMMARY OF THE INVENTION

An object of the present invention is providing an etching method for etching a silicon oxide film formed on a silicon nitride film with an etching gas containing fluorocarbon gas to form a hole having a high aspect ratio, in which etching of the portion of the silicon oxide film on the bottom of the hole is not stopped.

To attain the above object, the first etching method of the present invention is an etching method for forming a hole having a high aspect ratio in a silicon oxide film formed on a substrate via a silicon nitride film. The method includes the step of performing etching using an etching gas composed of a mixture of Ar gas, $O_2$ gas, $C_5F_8$ gas and $CH_2F_2$ gas.

According to the first etching method, the etching gas contains not only $C_5F_8$ gas that strongly tends to grow a deposition layer on the wall of the hole, but also $CH_2F_2$ gas that gives higher priority to progress of etching on the bottom of the hole than growth of a deposition layer on the wall of the hole. Therefore, the growth of a deposition layer on the wall of the hole is well balanced with the progress of etching on the bottom of the hole. This prevents an occurrence of stop of the etching on the bottom of the hole in the silicon oxide film.

In the first etching method, the ratio of the flow rate of the $CH_2F_2$ gas to the total flow rate of the $C_5F_8$ gas and the $CH_2F_2$ gas in the etching gas is preferably 20% or more.

By the above setting, the occurrence of stop of the etching on the bottom of the hole in the silicon oxide film can be reliably avoided.

In the first etching method, the ratio of the flow rate of the $CH_2F_2$ gas to the total flow rate of the $C_5F_8$ gas and the $CH_2F_2$ gas in the etching gas is preferably 50% or more.

By the above setting, after the formation of a hole in the silicon oxide film, the portion of the silicon nitride film exposed on the bottom of the hole can be successively etched.

In the first etching method, the ratio of the flow rate of the $CH_2F_2$ gas to the total flow rate of the $C_5F_8$ gas and the $CH_2F_2$ gas in the etching gas is preferably in the range of 50% to 70%.

By the above setting, when the silicon nitride film is exposed on the wall of the hole, the portion of the silicon nitride film exposed on the bottom of the hole can be etched without allowing the corners of the silicon nitride film on the wall to be etched.

The second etching method of the present invention is an etching method for forming a hole having a high aspect ratio in a laminated film formed on a substrate via a silicon nitride film, the laminated film including a lower layer composed of an impurity-containing silicon oxide film and an upper layer composed of a substantially impurity-free silicon oxide film. The method includes the steps of performing first-stage etching for the upper layer using a first etching gas composed of a mixture of Ar gas, $O_2$ gas and $C_5F_8$ gas in a relatively large mixing ratio of the $O_2$ gas to the fluorocarbon gas; and performing second-stage etching for the lower layer using a second etching gas composed of a mixture of Ar gas, $O_2$ gas, $C_5F_8$ gas and $CH_2F_2$ gas in a relatively small mixing ratio of the $O_2$ gas to the fluorocarbon gas.

According to the second etching method, the upper layer composed of a substantially impurity-free silicon oxide film is subjected to the first-stage plasma etching using the first etching gas composed of a mixture of Ar gas, $O_2$ gas and $C_5F_8$ gas in a relatively large mixing ratio of $O_2$ gas to the fluorocarbon gas. This enables formation of the upper part of the hole in a substantially vertical shape. The lower interlayer insulating film composed of an impurity-containing silicon oxide film is subjected to the second-stage plasma etching using the second etching gas composed of a mixture of Ar gas, $O_2$ gas, $C_5F_8$ gas and $CH_2F_2$ gas in a relatively small mixing ratio of $O_2$ gas to the fluorocarbon gas. This enables formation of the lower part of the hole without allowing the wall portions of the silicon nitride film exposed to the hole to be excessively etched and without stop of etching in the lower layer.

In the second etching method, the ratio of the flow rate of the $CH_2F_2$ gas to the total flow rate of the $C_5F_8$ gas and the $CH_2F_2$ gas in the second etching gas is preferably 20% or more.

By the above setting, an occurrence of stop of the etching on the bottom of the hole in the silicon oxide film can be reliably avoided.

In the second etching method, the ratio of the flow rate of the $CH_2F_2$ gas to the total flow rate of the $C_5F_8$ gas and the $CH_2F_2$ gas in the second etching gas is preferably 50% or more.

By the above setting, after the formation of a hole in the silicon oxide film, the portion of the silicon nitride film exposed on the bottom of the hole can be successively etched.

In the second etching method, the ratio of the flow rate of the $CH_2F_2$ gas to the total flow rate of the $C_5F_8$ gas and the $CH_2F_2$ gas in the second etching gas is preferably in the range of 50% to 70%.

By the above setting, when the silicon nitride film is exposed on the wall of the hole, the portion of the silicon nitride film exposed on the bottom of the hole can be etched without allowing the corners of the silicon nitride film on the wall to be etched.

The third etching method of the present invention is an etching method for forming a second hole having a high aspect ratio in a laminated film formed on a silicon nitride film defining a first hole formed on a substrate, the laminated film including a lower layer composed of an impurity-containing silicon oxide film and an upper layer composed of a substantially impurity-free silicon oxide film, the second hole being made integral with the first hole. The method includes the steps of: performing first-stage dry etching for the upper layer using a first etching gas composed of a mixture of Ar gas, $O_2$ gas and $C_5F_8$ gas in a relatively large mixing ratio of the $O_2$ gas to the fluorocarbon gas; performing second-stage dry etching for the lower layer using a second etching gas composed of a mixture of Ar gas, $O_2$ gas, $C_5F_8$ gas and $CH_2F_2$ gas in a relatively small mixing ratio of the $O_2$ gas to the fluorocarbon gas; and removing a residue of the lower layer in the first hole by wet etching.

According to the third etching method, as in the second etching method, the upper part of the second hole in a substantially vertical shape can be formed in the upper layer, and the lower part of the second hole can be formed without allowing the wall portions of the silicon nitride film exposed to the first hole to be excessively etched and without stop of etching in the lower layer.

In the third etching method, the ratio of the flow rate of the $CH_2F_2$ gas to the total flow rate of the $C_5F_8$ gas and the $CH_2F_2$ gas in the second etching gas is preferably in the range of 20% to 70%.

By the above setting, the second hole in a nearly vertical shape having a large taper angle can be formed.

In the third etching method, the lower layer is preferably a BPSG film containing 3.7 wt % of boron and 7.0 wt % of phosphorus.

The BPSG film having the above composition is excellent in flowability. Therefore, the first hole defined by the silicon nitride film can be reliably filled with the lower layer composed of the BPSG film.

DESCRIPTION OF THE PREFERRED EMBODIMENTS (Etching Apparatus)

Before discussing the etching methods of embodiments of the present invention, an etching apparatus used for implementing the etching methods will be described with reference to FIG. 1.

Figure 1:
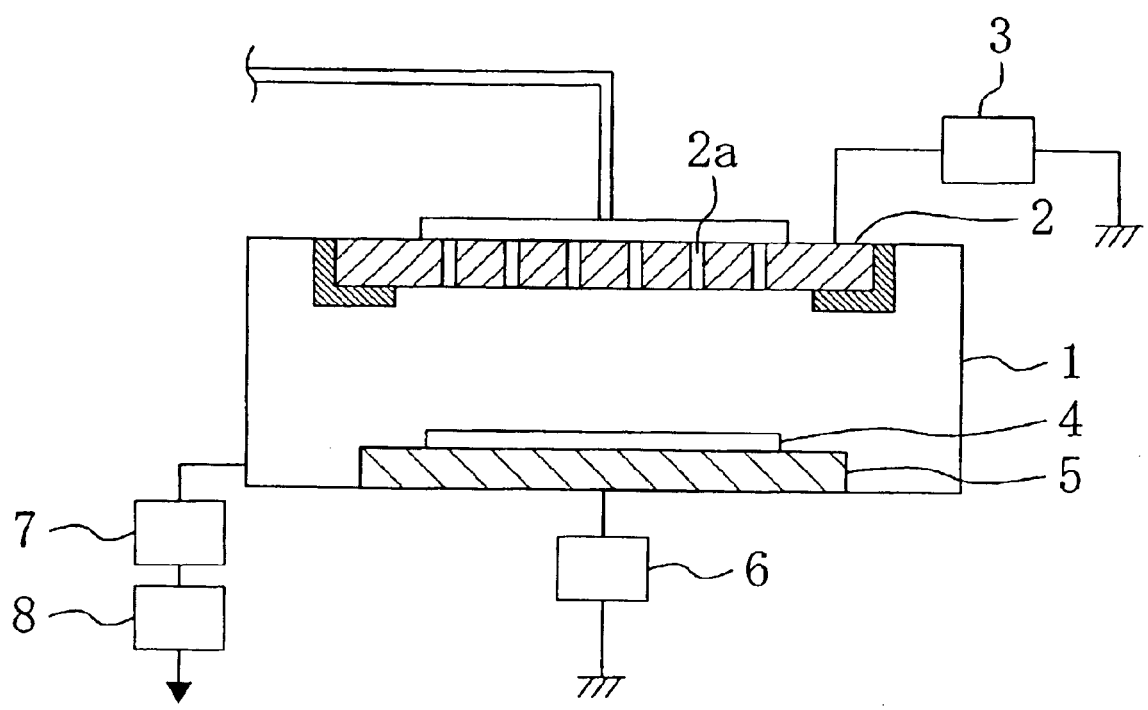
FIG. 1 is a cross-sectional view of an etching apparatus used for etching methods of embodiments of the present invention.

FIG. 1 shows a schematic cross-sectional view of an etching apparatus using dual frequency capacitive coupled plasma. As shown in FIG. 1, an upper electrode 2 is provided in the upper part of a reaction chamber 1. The upper electrode 2 has gas inlets 2a for feeding an etching gas into the reaction chamber 1. First high-frequency power is applied to the upper electrode 2 from a first high-frequency power supply 3. A lower electrode 5 is provided in the lower part of the reaction chamber 1 to be used as a sample stage for holding a silicon substrate 4. Second high-frequency power is applied to the lower electrode 5 from a second high-frequency power supply 6. A turbo-molecular pump 7 and a drying pump 8 are connected to the reaction chamber 1 at the wall for decompressing the inside of the reaction chamber 1.

The inside of the reaction chamber 1 is decompressed to a predetermined pressure by driving the turbo-molecular pump 7 and the drying pump 8. An etching gas is then fed into the reaction chamber 1 via the gas inlets 2a, and simultaneously the first high-frequency power is applied to the upper electrode 2 from the first high-frequency power supply 3. This causes generation of plasma composed of the etching gas inside the reaction chamber 1.

The second high-frequency power is then applied to the lower electrode 5 from the second high-frequency power supply. This causes the plasma of the etching gas to be attracted to the surface of the silicon substrate 4, to thereby permit etching of the silicon substrate 4.

The plasma used in the etching apparatus is not limited to dual frequency capacitive coupled plasma, but may be capacitive coupled plasma, inductively coupled plasma, microwave plasma, VHF plasma or the like.

Embodiment 1

The etching method of Embodiment 1 of the present invention will be described with reference to the relevant drawings.

Figure 2A:
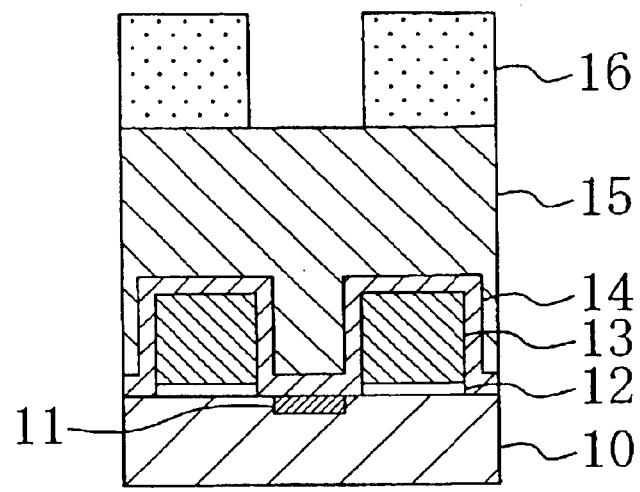
FIGS. 2A and 2B are cross-sectional views of process steps of the etching method of Embodiment 1 of the present invention.

As shown in FIG. 2A, gate interconnections 13 composed of a polysilicon film each having a height of 250 nm and a width of 200 nm are formed on a silicon substrate 10 via a gate insulating film 12. The substrate 10 includes a cobalt silicide layer 11 formed over a source/drain region. A silicon nitride film 14 having a thickness of 30 nm and then a silicon oxide film 15 composed of a BPSG film having a thickness of 700 nm are sequentially formed on the silicon substrate 10 including the gate interconnections 13. A resist pattern 16 having hole formation openings with a size of 20 nm is then formed over the silicon oxide film 15.

<Etching of Silicon Oxide Film>

Figure 2B:
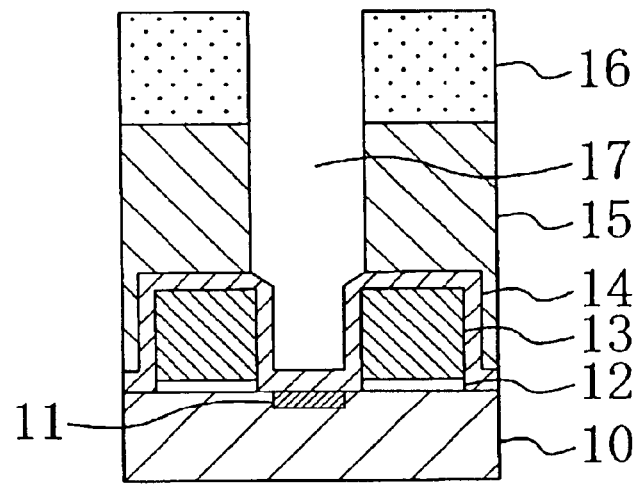

As shown in FIG. 2B, the silicon oxide film 15 is subjected to self-aligning contact etching using an etching gas having a ratio of the flow rate of $CH_2F_2$ gas to the total flow rate of $CH_2F_2$ gas and $C_5F_8$ gas (hereinafter, this ratio is referred to as the mixing ratio of $CH_2F_2$ gas) of 20% or more, such as an etching gas composed of a mixture of $CH_2F_2$ gas (flow rate: 5 ml/min (normal state)), $C_5F_8$ gas (flow rate: 8 ml/min (normal state)), Ar gas (flow rate: 800 ml/min (normal state)) and $O_2$ gas (flow rate: 4 ml/min (normal state)), for example, to form a contact hole 17.

In Embodiment 1, the etching gas includes, not only $C_5F_8$ gas that strongly tends to grow a deposition layer, but also $CH_2F_2$ gas that gives higher priority to progress of etching of the silicon oxide film than growth of a deposition layer. Therefore, the growth of a deposition layer on the wall of the contact hole 17 is well balanced with the progress of etching of the bottom of the contact hole 17. This can prevent an occurrence of stop of the etching due to formation of a deposition layer on the bottom of the contact hole 17. The reason is described with reference to reaction formulae as follows.

When the fluorocarbon gas includes only $C_5F_8$ gas, the following chemical reaction occurs.

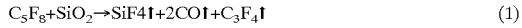

$$C_5F_8 + SiO_2 \rightarrow SiF_4\uparrow + 2CO\uparrow + C_3F_4\uparrow \quad (1)$$

When the fluorocarbon gas includes $C_5F_8$ gas and $CH_2F_2$ gas, the following chemical reaction occurs.

$$C_5F_8 + CH_2F_2 + SiO_2 \rightarrow SiF_4\uparrow + 2CO\uparrow + C_3F_6\uparrow + CH_2\uparrow \quad (2)$$

In reaction (1), $C_3F_4$ (C/F=0.75) is generated as a reaction product, while in reaction (2), $C_3F_6$ (C/F=0.50) is generated as a reaction product. Since the C/F ratio of $C_3F_6$ is smaller than that of $C_3F_4$, reaction (2) can suppress growth of a deposition layer and thus prevent an occurrence of stop of the etching due to formation of a deposition layer on the bottom of the contact hole 17.

In particular, in Embodiment 1, in which an etching gas having a mixing ratio of $CH_2F_2$ of 20% or more is used, it is possible to reliably block an occurrence of stop of the etching of the silicon oxide film 15 on the bottom of the contact hole 17. The reason for this is described as follows with reference to FIGS. 3A to 3C.

Figure 3A:
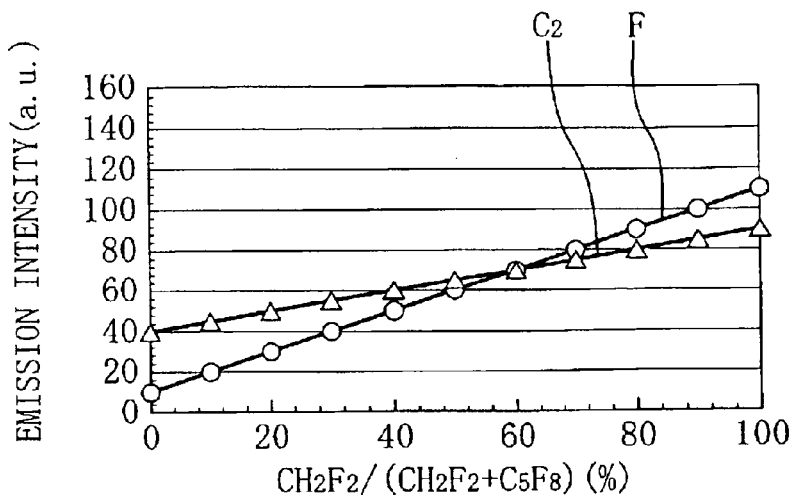
FIG. 3A is a view showing the relationships between the mixing ratio of $CH_2F_2$ gas and the emission intensities of fluorine and carbon.
Figure 3B:
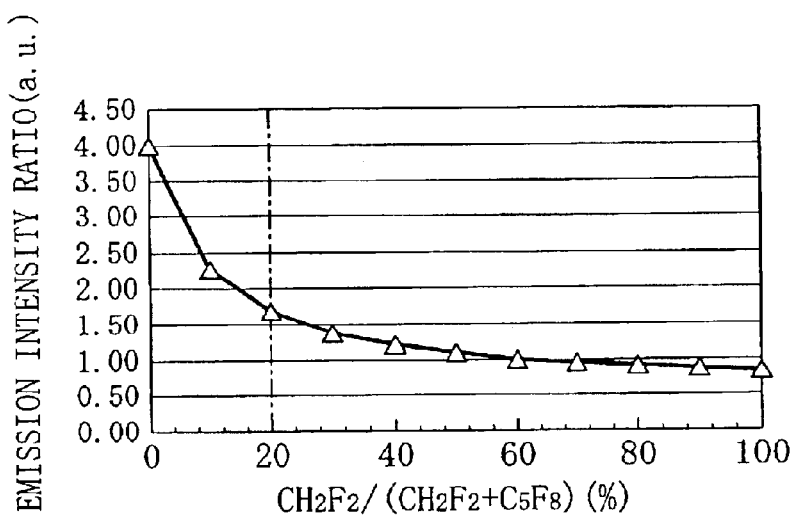
FIG. 3B is a view showing the relationship between the mixing ratio of $CH_2F_2$ gas and the emission intensity of $C_2$/emission intensity of F.
Figure 3C:
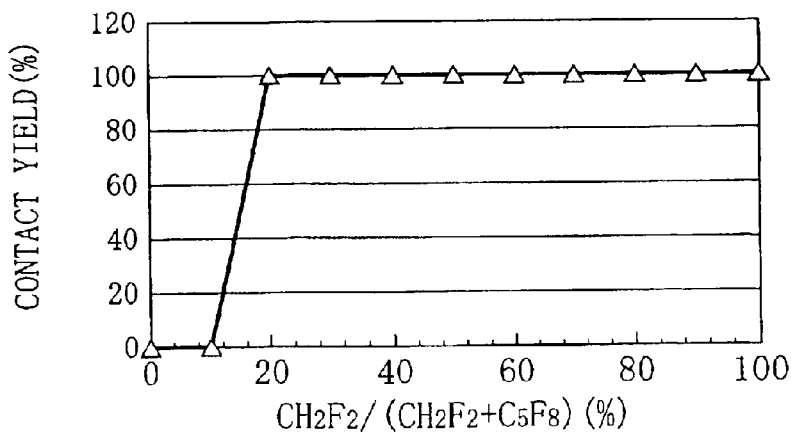
FIG. 3C is a view showing the relationship between the mixing ratio of $CH_2F_2$ gas and the yield of contact holes.

FIG. 3A shows the relationships between the mixing ratio of $CH_2F_2$ gas and the emission intensities of fluorine (F; 685 nm) and carbon ($C_2$; 516 nm). FIG. 3B shows the relationship between the mixing ratio of $CH_2F_2$ gas and the emission intensity of F/emission intensity of $C_2$ (hereinafter, this ratio is referred to as the emission intensity ratio). FIG. 3C shows the relationship between the mixing ratio of $CH_2F_2$ gas and the yield of contact holes.

As shown in FIG. 3A, with increase of the mixing ratio of $CH_2F_2$ gas, that is, with increase of the ratio of $CH_2F_2$ gas in the fluorocarbon gas, the emission intensity of fluorine increases. In addition, due to the fluorine scavenging effect of hydrogen contained in the $CH_2F_2$ gas, the emission intensity of carbon also increases with increase of the mixing ratio of $CH_2F_2$ gas, although the degree of increase is greater in the emission intensity of fluorine than the emission intensity of carbon.

For the reason described above, the emission intensity ratio decreases with the increase of $CH_2F_2$ gas as shown in FIG. 3B. The emission intensity ratio sharply decreases with increase of the mixing ratio of $CH_2F_2$ gas before the mixing ratio of $CH_2F_2$ gas reaches 20%. When the mixing ratio of $CH_2F_2$ gas reaches and exceeds 20%, however, the rate of the decrease of the emission intensity ratio slows down. This indicates that the concentration of carbon ions in the plasma reliably decreases when the mixing ratio of $CH_2F_2$ gas is 20% or more.

Thus, when the mixing ratio of $CH_2F_2$ gas is 20% or more, the amount of a deposition attaching to the bottom of the contact hole 17 reliably decreases, and as a result, as shown in FIG. 3C, the yield of contact holes is sharply increases.

<Etching of the Silicon Nitride Film>

Next, etching of the portion of the silicon nitride film 14 exposed on the bottom of the contact hole 17 will be described.

The silicon oxide film 15 is reliably etched to form a good contact hole 17 by using the etching gas described above, that is, the etching gas containing $CH_2F_2$ gas and $C_5F_8$ gas in a mixing ratio of $CH_2F_2$ gas of 20% or more but less than 50%, such as an etching gas containing $C_5F_8$ gas in a flow rate of 8 ml/min (normal state) and $CH_2F_2$ gas in a flow rate of 2 to 8 ml/min (normal state) as the fluorocarbon gas, for example. However, the portion of the silicon nitride film 14 exposed on the bottom of the contact hole 17 is hardly etched with this etching gas.

The portion of the silicon nitride film 14 exposed on the bottom of the contact hole 17 is etched with another etching gas that is excellent in etching selectivity for the silicon nitride film 14, such as an etching gas containing $CHF_3$ gas as the fluorocarbon gas.

Figure 4A:
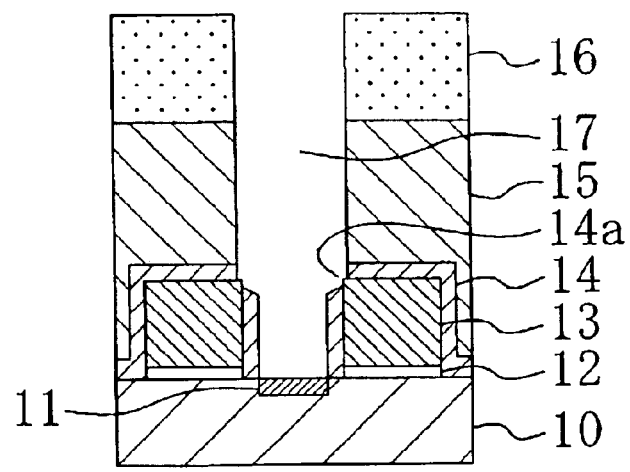
FIGS. 4A to 4C are cross-sectional views for demonstrating etching for the portion of a silicon nitride film on the bottom of a contact hole in the etching method of Embodiment 1 of the present invention.
Figure 4B:
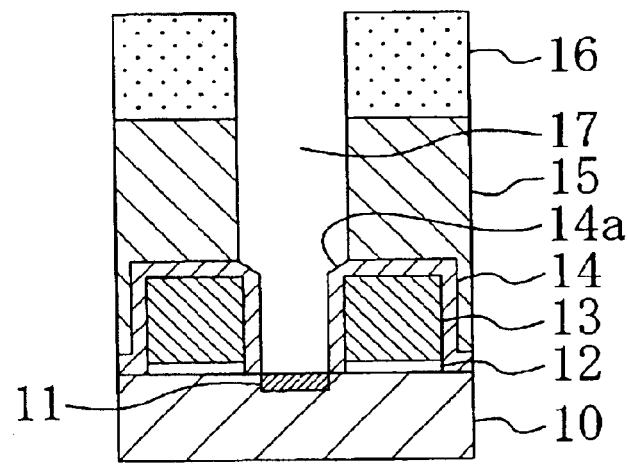

However, using such an etching gas excellent in etching selectivity for the silicon nitride film 14, the corners of the silicon nitride film 14 (shoulders of the gate interconnections 13) are also etched as shown in FIG. 4A, causing a problem of the gate interconnections 13 being exposed to the contact hole 17.

In view of the above, as the etching gas for the etching of the silicon oxide film 15, used is an etching gas containing $CH_2F_2$ gas and $C_5F_8$ gas in a mixing ratio of $CH_2F_2$ gas in the range of 50% to 70%, such as an etching gas containing $C_5F_8$ gas in a flow rate of 8 ml/min (normal state) and $CH_2F_2$ gas in a flow rate of 8 to 18 ml/min (normal state) as the fluorocarbon gas, for example.

By using the above etching gas, the silicon oxide film 15 is reliably etched ensuring formation of a good contact hole 17. Subsequently, the portion of the silicon nitride film 14 exposed on the bottom of the contact hole 17 is also etched, to finally expose the cobalt silicide layer 11 to the contact hole 17 while the corners of the silicon nitride film 14 is protected from being etched away.

If the silicon oxide film 15 is etched using an etching gas containing $CH_2F_2$ gas and $C_5F_8$ gas in a mixing ratio of $CH_2F_2$ gas exceeding 70%, such as an etching gas containing $C_5F_8$ gas in a flow rate of 8 ml/min (normal state) and $CH_2F_2$ gas in a flow rate higher than 18 ml/min (normal state) as the fluorocarbon gas, for example, the results will be as follows.

The silicon oxide film 15 is reliably etched ensuring formation of a good contact hole 17, and subsequently, the portion of the silicon nitride film 14 exposed on the bottom of the contact hole 17 is etched, to finally expose the cobalt silicide layer 11 to the contact hole 17.

Figure 4C:
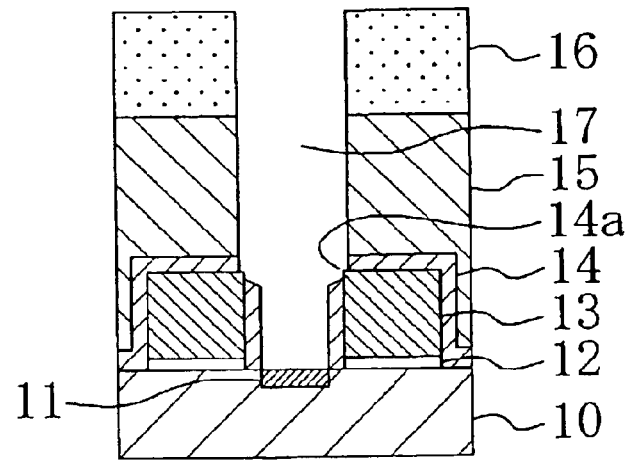

However, since the etching gas having a mixing ratio of $CH_2F_2$ gas exceeding 70% exhibits a high etching selectivity for the silicon nitride film 14, the corners of the silicon nitride film 14 (shoulders of the gate interconnections 13) will also be etched as shown in FIG. 4C. This will cause a problem of the gate interconnections 13 being exposed to the contact hole 17.

Therefore, it is most preferable to use an etching gas containing $CH_2F_2$ gas and $C_5F_8$ gas in a mixing ratio of $CH_2F_2$ gas in the range of 50% to 70%.

Hereinafter, various etching models obtained by varying the mixing ratio of $CH_2F_2$ gas will be described with reference to FIGS. 5A to 5D.

Figure 5A:
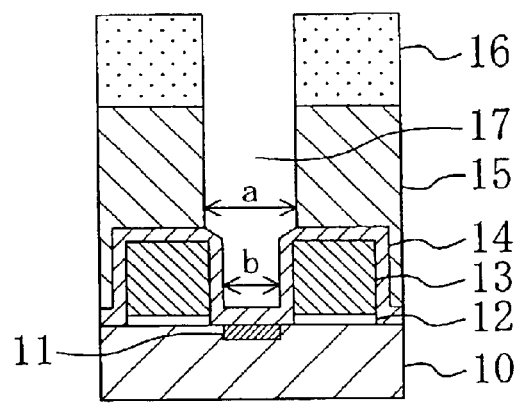
FIGS. 5A to 5D are cross-sectional views demonstrating etching models obtained by varying the mixing ratio of $CH_2F_2$ gas in the etching method of Embodiment 1 of the present invention.

FIG. 5A shows the state before the etching of the portion of the silicon nitride film 14 exposed on the bottom of the contact hole 17. Referring to FIG. 5A, the size a of the upper part of the contact hole 17 located above the position of the silicon nitride film 14 is 200 nm, while the size b of the lower part of the contact hole 17 in which the silicon nitride film 14 is formed is 100 to 150 nm.

Figure 5B:
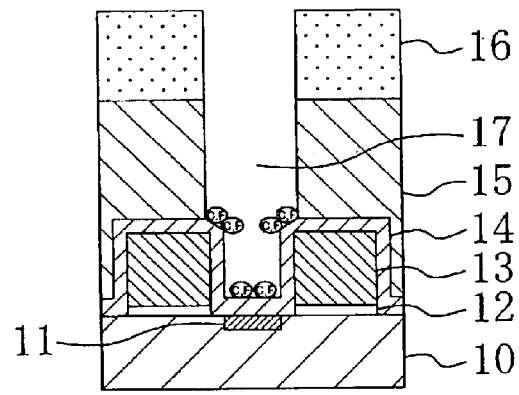
Figure 5C:
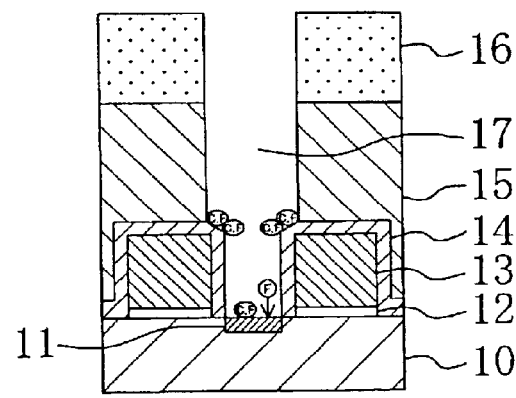
Figure 5D:
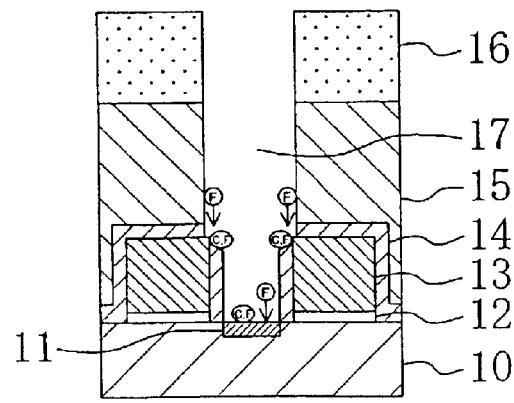

FIG. 5B shows a model obtained when the mixing ratio of $CH_2F_2$ gas is more than 0 and less than 50%. FIG. 5C shows a model obtained when the mixing ratio of $CH_2F_2$ gas is in the range of 50% to 70%. FIG. 5D shows a model obtained when the mixing ratio of $CH_2F_2$ gas exceeds 70%.

When the mixing ratio of $CH_2F_2$ gas is more than 0 and less than 50%, as shown in FIG. 5B, a large amount of a deposition composed of $C_xF_y$ attaches to the portions of the silicon nitride film 14 corresponding to the corners of the gate interconnections 13 and the bottom of the contact hole 17. This prevents etching of the silicon nitride film 14 with fluorine.

When the mixing ratio of $CH_2F_2$ gas is in the range of 50% to 70%, as shown in FIG. 5C, while a large amount of the deposition composed of $C_xF_y$ attaches to the portions of the silicon nitride film 14 corresponding to the corners of the gate interconnections 13, only a small amount of the deposition composed of $C_xF_y$ attaches to the bottom of the contact hole 17. The reason is as follows. The hole size a is large (200 nm) and thus the area is large at positions of the silicon nitride film 14 corresponding to the corners of the gate interconnections 13. These positions are therefore easily subjected to the plasma. On the contrary, the hole size b is small (100 to 150 nm) and thus the area is small at the bottom of the contact hole 17. The bottom is therefore not easily subjected to the plasma. As a result, with fluorine ions entering the portion of the silicon nitride film 14 on the bottom of the contact hole 17, the etching of this portion of the silicon nitride film 14 proceeds.

When the mixing ratio of $CH_2F_2$ gas exceeds 70%, as shown in FIG. 5D, a deposition composed of $C_xF_y$ hardly attaches to the portions of the silicon nitride film 14 corresponding to the corners of the gate interconnections 13 and the bottom of the contact hole 17. Therefore, the etching of the silicon nitride film 14 with fluorine ions proceeds.

Figure 6:
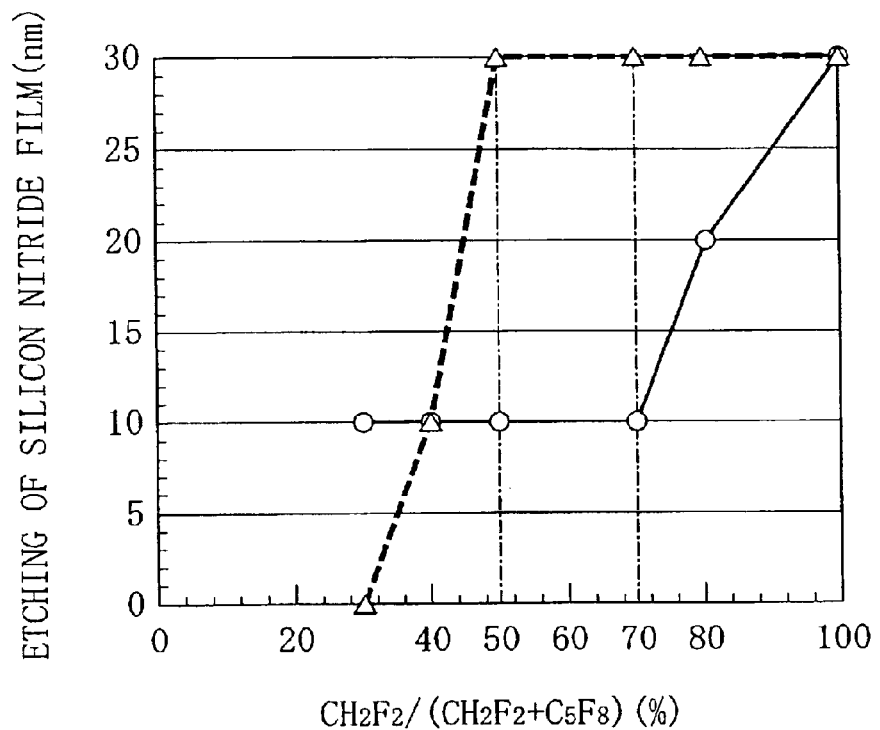
FIG. 6 is a view showing the relationship between the mixing ratio of $CH_2F_2$ gas and the amount of etching of the silicon nitride film in the etching method of Embodiment 1 of the present invention.

FIG. 6 shows the relationship between the mixing ratio of $CH_2F_2$ gas and the etching amount of the silicon nitride film 14. Referring to FIG. 6, marks ○ represent the etching amount of the portions of the silicon nitride film 14 corresponding to the corners of the gate interconnections 13 and marks Δ represent the etching amount of the portion of the silicon nitride film 14 on the bottom of the contact hole 17. As is found from FIG. 6, when the mixing ratio of $CH_2F_2$ gas exceeds 70%, the etching amount of the portions of the silicon nitride film 14 corresponding to the corners of the gate interconnections 13 sharply increases. When the mixing ratio of $CH_2F_2$ gas is less than 50%, the etching amount of the portion of the silicon nitride film 14 on the bottom of the contact hole 17 sharply decreases.

Figure 7:
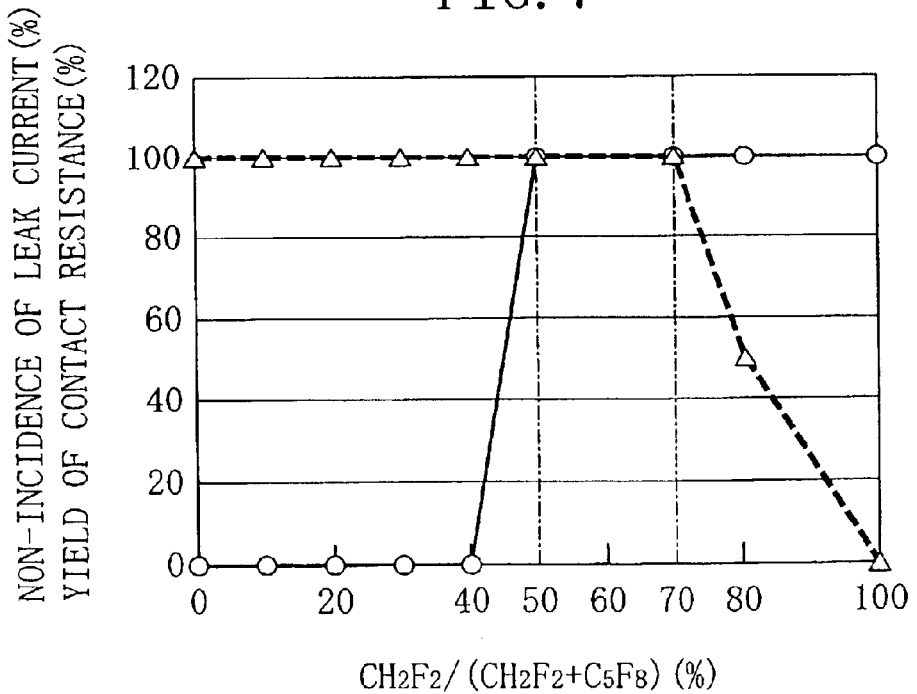
FIG. 7 is a view showing the relationships between the mixing ratio of $CH_2F_2$ gas and the non-incidence of leak current and between the mixing ratio of $CH_2F_2$ gas and the yield of contact resistance in the etching method of Embodiment 1 of the present invention.

FIG. 7 shows the relationships between the mixing ratio of $CH_2F_2$ gas and the non-incidence of leak current (represented by Δ) and between the mixing ratio of $CH_2F_2$ gas and the yield of contact resistance (represented by ○). The non-incidence of leak current is determined to be 0% when a leak current flows by short-circuiting between the gate interconnection 13 and a conductive film with which the contact hole 17 is filled, and 100% when no leak current flows and the normal state remains because the gate interconnection 13 is not in contact with the conductive film in the contact hole 17. The yield of contact resistance is determined to be 0% when the resistance value is infinite because the cobalt silicide film 11 is not in contact with the conductive layer in the contact hole 17, and 100% when the resistance value is normal because the cobalt silicide film 11 is reliably in contact with the conductive layer in the contact hole 17.

The conditions for guaranteeing that a device is a good product are that the non-incidence of leak current is 100% and the yield of contact resistance is 100%. In consideration of this, a good device will be obtained by using an etching gas having a mixing ratio of $CH_2F_2$ gas in the range of 50% to 70%.

As is understood from the above description, an etching gas containing $CH_2F_2$ gas and $C_5F_8$ gas in a mixing ratio of $CH_2F_2$ gas in the range of 50% to 70% is advantageously used for the etching of the portion of the silicon nitride film 14 exposed on the bottom of the contact hole 17. By using such an etching gas, the portions of the silicon nitride film 14 corresponding to the corners of the gate interconnections 13 are prevented from being etched excessively. This will keep the gate interconnections 13 from being in contact with a conductive film with which the contact hole 17 is filled. In addition, the portion of the silicon nitride film 14 on the bottom of the contact hole 17 is reliably etched, and this ensures the cobalt silicide layer 11 to be in contact with the conductive film with which the contact hole 17 is filled.

Embodiment 2

The etching method of Embodiment 2 of the present invention will be described with reference to the relevant drawings.

Figure 8A:
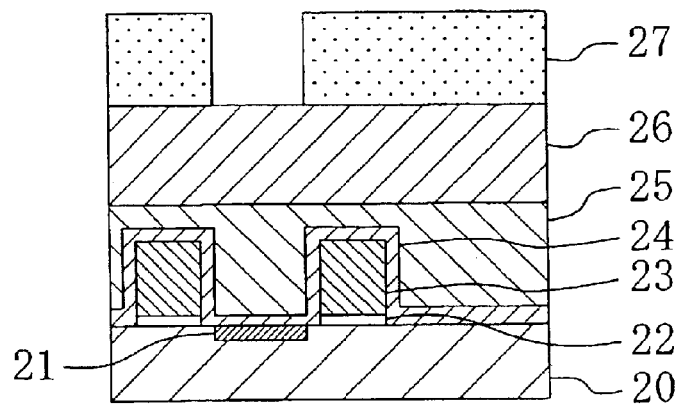
FIGS. 8A to 8D are cross-sectional views of process steps of the etching method of Embodiment 2 of the present invention.

First, as shown in FIG. 8A, gate interconnections 23 composed of a polysilicon film each having a height of 250 nm and a width of 200 nm are formed on a silicon substrate 20 via a gate insulating film 22. The substrate 20 includes a cobalt silicide layer 21 formed over a source/drain region. A silicon nitride film 24 having a thickness of 30 nm is then deposited on the silicon substrate 20 including the gate interconnections 23. The silicon nitride film 24 defines a concave shape corresponding to the space between the gate interconnections 23.

A lower interlayer insulating film 25 is then formed on the silicon nitride film 24 so as to fill the concave portion defined by the silicon nitride film 24. The lower interlayer insulating film 25 is composed of a BPSG film containing 3.9 wt % of boron and 7.0 wt % of phosphorous and has a thickness of 350 nm. The lower interlayer insulating film 25 is flattened by CMP, and thereafter an upper interlayer insulating film 26 is formed on the lower interlayer insulating film 25 by plasma CVD. The upper interlayer insulating film 26 is composed of a substantially impurity-free silicon oxide film having a thickness of 350 nm.

A resist pattern 27 having hole formation openings with a size of 200 nm is then formed over the upper interlayer insulating film 26.

Figure 8B:
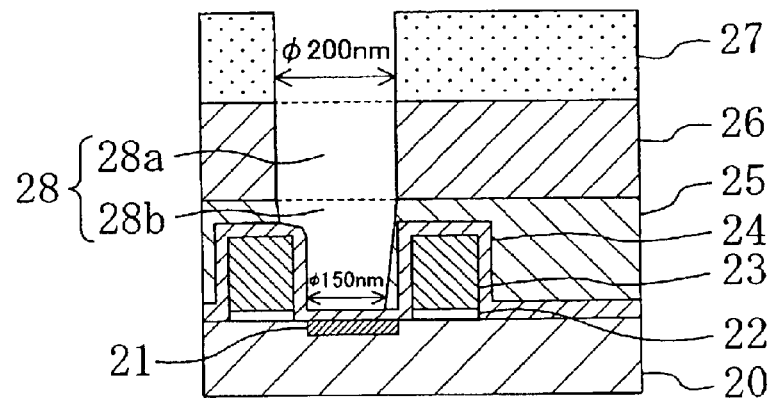

The upper interlayer insulating film 26 is then subjected to plasma etching using a first etching gas composed of a mixture of Ar gas, $O_2$ gas and $C_5F_8$ gas in a relatively large mixing ratio of $O_2$ gas to the fluorocarbon gas, such as an etching gas composed of a mixture of Ar gas in a flow rate of 800 ml/min (normal state), $O_2$ gas in a flow rate of 35 ml/min (normal state) and $C_5F_8$ gas in a flow rate of 15 ml/min (normal state), for example, to form an upper part 28a of a contact hole 28 through the upper interlayer insulating film 26 as shown in FIG. 8B.

Thereafter, the lower interlayer insulating film 25 is subjected to self-aligning contact etching using a second etching gas composed of a mixture of Ar gas, $O_2$ gas, $C_5F_8$ gas and $CH_2F_2$ gas in a relatively small mixing ratio of $O_2$ gas to the fluorocarbon gas, such as an etching gas composed of a mixture of Ar gas in a flow rate of 800 ml/min (normal state), $O_2$ gas in a flow rate of 4 ml/min (normal state), $C_5F_8$ gas in a flow rate of 8 ml/min (normal state) and $CH_2F_2$ gas in a flow rate of 5 ml/min (normal state), to form a lower part 28b of the contact hole 28 through the lower interlayer insulating film 25 as shown in FIG. 8B.

In Embodiment 2, the first etching gas composed of a mixture of Ar gas, $O_2$ gas and $C_5F_8$ gas in a relatively large mixing ratio of $O_2$ gas to the fluorocarbon gas is used for the first-stage plasma etching for the upper interlayer insulating film 26 composed of a substantially impurity-free silicon oxide film. This enables formation of the upper part 28a of the contact hole 28 in a substantially vertical shape.

The ratio of the flow rate of $O_2$ gas to the total flow rate of $O_2$ gas and $C_5F_8$ gas (mixing ratio of $O_2$ gas) in the first etching gas is preferably 60% or more. By using such an etching gas, it is possible to form the upper part 28a of the contact hole 28 in a substantially vertical shape having a size of 200 nm both at the top and bottom.

In addition, the second etching gas composed of a mixture of Ar gas, $O_2$ gas, $C_5F_8$ gas and $CH_2F_2$ gas in a relatively small mixing ratio of $O_2$ gas to the fluorocarbon gas is used for the second-stage plasma etching of the lower interlayer insulating film 25 composed of a BPSG film. Since the mixing ratio of $O_2$ gas to the fluorocarbon gas is relatively small, the portions of the silicon nitride film 24 on the walls of the contact hole 28 are protected from excessive etching. Also, since $CH_2F_2$ gas is contained in the second etching gas, the lower part 28b of the contact hole 28 can be formed without stop of the etching.

As described in Embodiment 1, if the mixing ratio of $CH_2F_2$ gas in the second etching gas is 20% or more, it is possible to reliably block an occurrence of stop of the etching due to formation of a deposition layer on the bottom of the contact hole 28. If the mixing ratio of $CH_2F_2$ gas in the second etching gas is 50% or more, it is possible to proceed to the etching of the portion of the silicon nitride film 24 on the bottom of the contact hole 28 successively from the etching of the lower interlayer insulating film 25. If the mixing ratio of $CH_2F_2$ gas in the second etching gas is in the range of 50% to 70%, it is possible to etch the portion of the silicon nitride film 24 on the bottom of the contact hole 28 without allowing excessive etching of the portions of the silicon nitride film 24 corresponding to the shoulders of the gate interconnections 23.

For the reasons described above, in Embodiment 2, the mixing ratio of $CH_2F_2$ gas in the second etching gas is preferably in the range of 20% to 70%.

By performing the etching in the manner described above, it is possible to form the upper part 28a of the contact hole 28 having a size of 200 nm both at the top and bottom, and also form the lower part 28b of the contact hole 28 having a size of 200 nm at the top and 150 nm at the bottom. That is, it is possible to form the contact hole 28 having a size of 200 nm at the top and 150 nm at the bottom.

In Embodiment 2, the lower interlayer insulating film 25 is composed of the BPSG film containing 3.9 wt % of boron and 7.0 wt % of phosphorus, which is excellent in flowability. Therefore, it is possible to fill the concave portion defined by the silicon nitride film 24 with the lower interlayer insulating film 25.

The upper interlayer insulating film 26 is composed of a substantially impurity-free silicon oxide film. Therefore, in the etching of the upper interlayer insulating film 26 for formation of the upper part 28a of the contact hole 28, it is possible to avoid an occurrence that the silicon nitride film 24 may be etched resulting in exposing the gate interconnection 23. To state in more detail, by the flattening of the lower interlayer insulating film 25 by CMP, the thickness of the portions of the lower interlayer insulating film 25 deposited on the tops of the gate interconnections 23 is made small. In this situation, if the BPSG film is used as the upper interlayer insulating film 26 and the etching gas having a mixing ratio of $O_2$ gas of 60% or more is used for formation of the upper part 28a of the contact hole 28 in a substantially vertical shape, the silicon nitride film 24 will possibly be etched resulting in exposing the gate interconnections 23 because the etching selectivity for the BPSG film over the silicon nitride becomes small. In this embodiment, however, the substantially impurity-free silicon oxide film is used as the upper interlayer insulating film 26, and thus, the silicon nitride film 24 is hardly etched during the etching of the upper interlayer insulating film 26 for formation of the upper part 28a of the contact hole 28.

Figure 8C:
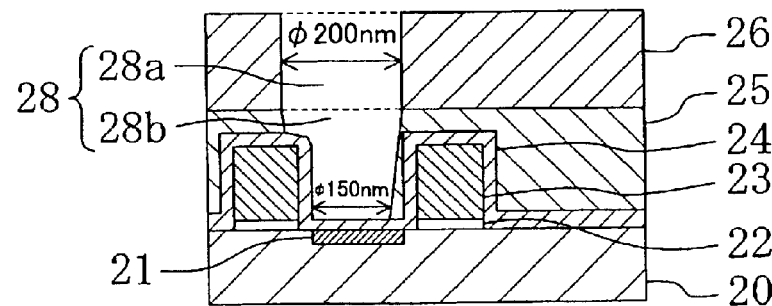
Figure 8D:
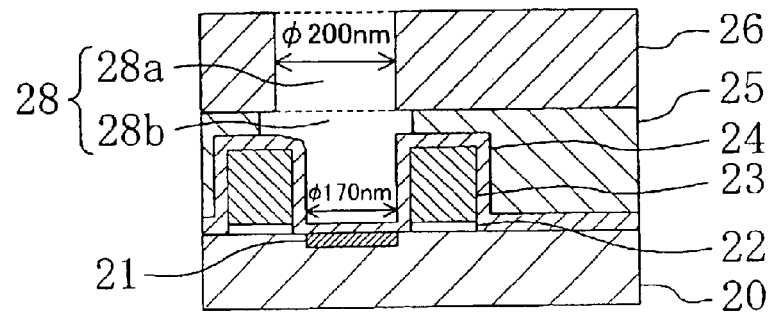
Figure 9A:
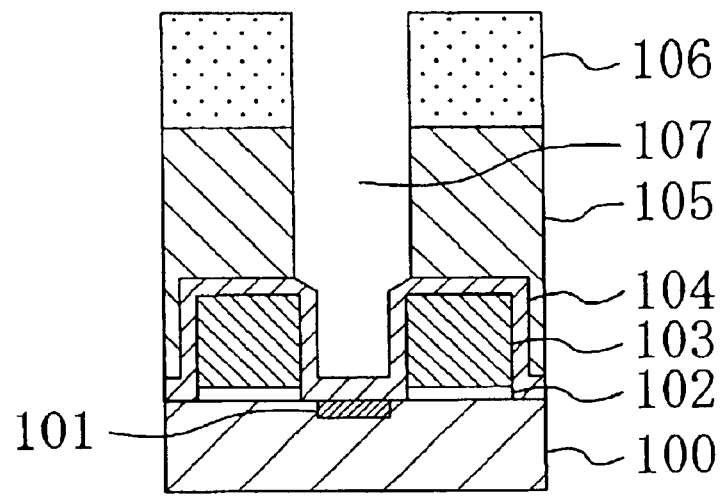
FIGS. 9A and 9B are cross-sectional views of process steps of a conventional etching method.
Figure 9B:
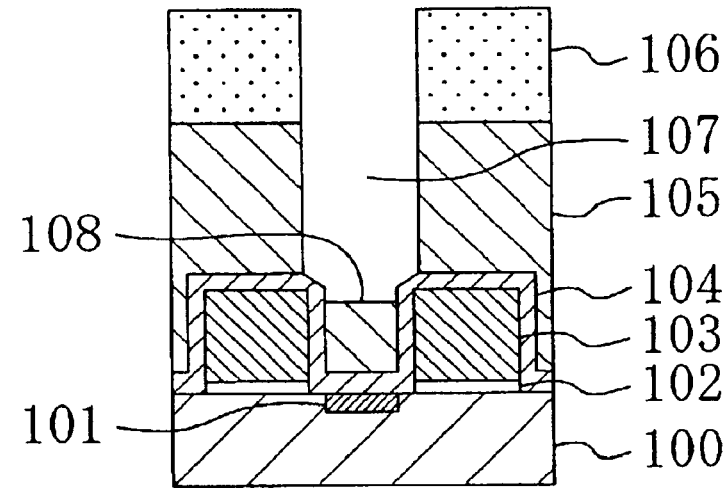

Thereafter, as shown in FIG. 8C, the resist pattern 27 and the polymer film remaining in the contact hole 28 are removed, and as shown in FIG. 8D, a residue of the lower interlayer insulating film 25 in the contact hole 28 is removed by wet etching using an aqueous solution containing hydrofluoric acid.

In the wet etching, while the tight upper interlayer insulating film 26 composed of an impurity-free silicon oxide film is not etched with the aqueous hydrofluoric acid solution, the lower interlayer insulating film 25 composed of the BPSG film having a high boron/phosphorus concentration is etched with the aqueous hydrofluoric acid solution. Therefore, by the wet etching, the residue of the lower interlayer insulating film 25 in the contact hole 28 can be reliably removed.

By the removal of the residue, the size of the contact hole 28 at the bottom is widened to 170 nm, and this reduces the contact resistance.

A comparative example performed for evaluation of the etching method of Embodiment 2 will be described with reference to FIGS. 10A and 10B.

Figure 10A:
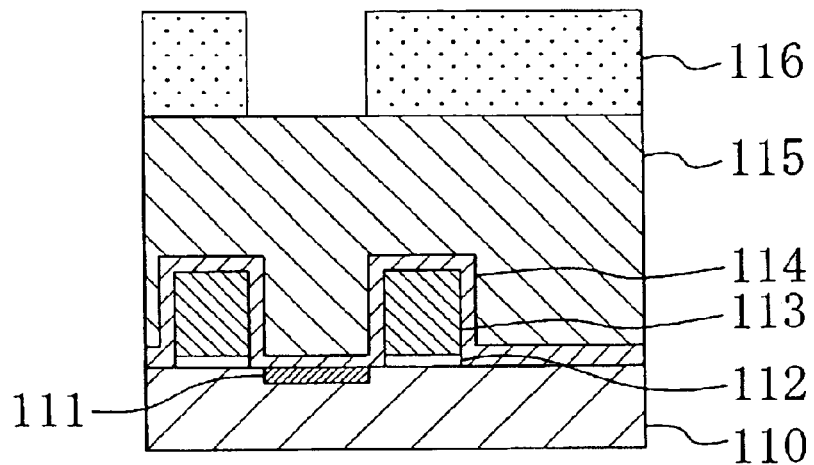
FIGS. 10A and 10B are cross-sectional views of process steps of an etching method of a comparative example in Embodiment 2 of the present invention.

As shown in FIG. 10A, as in Embodiment 2, gate interconnections 113 composed of a polysilicon film each having a height of 250 nm and a width of 200 nm are formed on a silicon substrate 110 including a cobalt suicide layer 111 via a gate insulating film 112. A silicon nitride film 114 is then formed on the silicon substrate 110 including the gate interconnections 113. On the silicon nitride film 114, formed is an interlayer insulating film 115 composed of a BPSG film containing 3.9 wt % of boron and 7.0 wt % of phosphorous having a thickness of 700 nm.

The interlayer insulating film 115 is then subjected to plasma etching with an etching gas composed of a mixture of Ar gas in a flow rate of 800 ml/min (normal state), $O_2$ gas in a flow rate of 4 ml/min (normal state), $C_5F_8$ gas in a flow rate of 8 ml/min (normal state) and $CH_2F_2$ gas in a flow rate of 5 ml/min (normal state), to form a contact hole 117 through the interlayer insulating film 115.

Figure 10B:
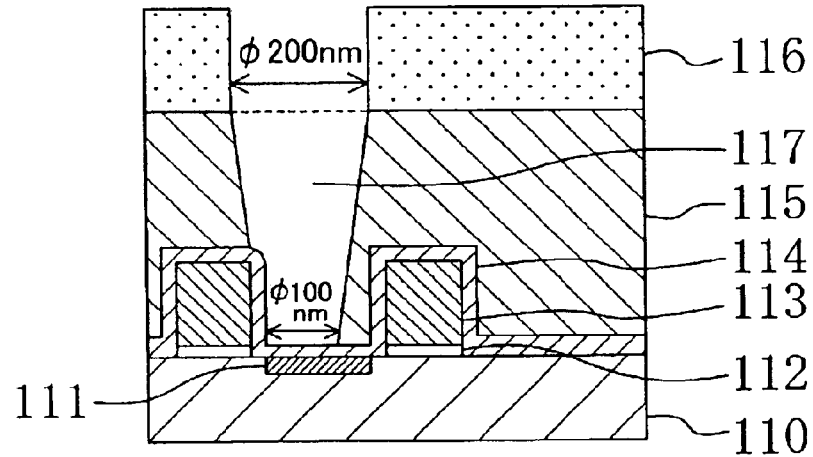

In the comparative example, as shown in FIG. 10B, the resultant contact hole 117 has a tapered shape with a taper angle of 85 degrees or less and a size of 200 nm at the top and 100 nm at the bottom. With this small size at the bottom of the contact hole, the contact resistance is large. If a large displacement occurs in the alignment between the contact hole 117 and the space between the gate interconnections 113, the size of the contact hole 117 at the bottom will be further reduced.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. An etching method for forming a hole having a high aspect ratio in a laminated film comprising a silicon nitride film, as a lower layer, and a silicon oxide film, as an upper layer, the silicon nitride film and the silicon oxide film are laminated on a substrate, the method comprising the step of:

etching the laminated film using an etching gas composed of a mixture of $C_5F_8$ gas and $CH_2F_2$ gas, wherein the etching step further includes a step of continuously performing a first sub-step of forming an upper portion of the hole in the silicon oxide film by performing a first-stage etching of the silicon oxide film, and a second sub-step of forming a lower portion of the hole in the silicon oxide film by performing a second-stage etching of the silicon nitride film exposed by the first-stage etching.

2. The method of claim 1 wherein the ratio of the flow rate of the $CH_2F_2$ gas to the total flow rate of the $C_5F_8$ gas and the $CH_2F_2$ gas in the etching gas is 50% or more.

3. The method of claim 1, wherein the ratio of the flow rate of the $CH_2F_2$ gas to the total flow rate of the $C_5F_8$ gas and the $CH_2F_2$ gas in the etching gas is in the range of 50% to 70%.

4. An etching method for forming a hole having a high aspect ratio in a laminated film formed on a substrate via a silicon nitride film, the laminated film including a lower layer composed of an impurity-containing silicon oxide film and an upper layer composed of a substantially impurity-free silicon oxide film, the method comprising the steps of:

performing first-stage etching for the upper layer using a first etching gas composed of a mixture of Ar gas, $O_2$ gas and $C_5F_8$ gas in a relatively large mixing ratio of the $O_2$ gas to the fluorocarbon gas; and performing second-stage etching for the lower layer using a second etching gas composed of a mixture of Ar gas, $O_2$ gas, $C_5F_8$ gas and $CH_2F_2$ gas in a relatively small mixing ratio of the $O_2$ gas to the fluorocarbon gas.

5. The method of claim 4, wherein the ratio of the flow rate of the $CH_2F_2$ gas to the total flow rate of the $C_5F_8$ gas and the $CH_2F_2$ gas in the second etching gas is 20% or more.

6. The method of claim 4, wherein the ratio of the flow rate of the $CH_2F_2$ gas to the total flow rate of the $C_5F_8$ gas and the $CH_2F_2$ gas in the second etching gas is 50% or more.

7. The method of claim 4, wherein the ratio of the flow rate of the $CH_2F_2$ gas to the total flow rate of the $C_5F_8$ gas and the $CH_2F_2$ gas in the second etching gas is in the range of 50% to 70%.

8. An etching method for forming a second hole having a high aspect ratio in a laminated film, formed on a silicon nitride film defining a first hole formed on a substrate, the laminated film including a lower layer composed of an impurity-containing silicon oxide film and an upper layer composed of a substantially impurity-free silicon oxide film, the second hole being made integral with the first hole, the method comprising the steps of:

performing first-stage dry etching for the upper layer using a first etching gas composed of a mixture of Ar gas, $O_2$ gas and $C_5F_8$ gas in a relatively large mixing ratio of the $O_2$ gas to the fluorocarbon gas;

performing second-stage dry etching for the lower layer using a second etching gas composed of a mixture of Ar gas, $O_2$ gas, $C_5F_8$ gas and $CH_2F_2$ gas in a relatively small mixing ratio of the $O_2$ gas to the fluorocarbon gas; and removing a residue of the lower layer in the first hole by wet etching.

9. The method of claim 8, wherein the ratio of the flow rate of the $CH_2F_2$ gas to the total flow rate of the $C_5F_8$ gas and the $CH_2F_2$ gas in the second etching gas is in the range of 20% to 70%.

10. The method of claim 8, wherein the lower layer is a BPSG film containing 3.7 wt % of boron and 7.0 wt % of phosphorus.

* * * * *

UNITED STATES PATENT AND TRADEMARK OFFICE
CERTIFICATE OF CORRECTION

PATENT NO. : 6,939,806 B2
DATED : September 6, 2005
INVENTOR(S) : Jiwari, Nobuhiro It is certified that error appears in the above-identified patent and that said Letters Patent is hereby corrected as shown below:

Title page,
Item [54], Title, change "MEMORY" to -- METHOD --.

Signed and Sealed this

Thirteenth Day of December, 2005

JON W. DUDAS
*Director of the United States Patent and Trademark Office*